(12) United States Patent
Doubchak et al.

(10) Patent No.: US 11,115,055 B2
(45) Date of Patent: Sep. 7, 2021

(54) METHOD AND APPARATUS FOR ENCODING AND DECODING DATA IN MEMORY SYSTEM

(71) Applicant: SAMSUNG ELECTRONICS CO., LTD., Suwon-si (KR)

(72) Inventors: Ariel Doubchak, Ramat Gan (IL); Dikla Shapiro, Ramat Gan (IL); Amit Berman, Ramat Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 295 days.

(21) Appl. No.: 16/244,944

(22) Filed: Jan. 10, 2019

(65) Prior Publication Data
US 2020/0228144 A1   Jul. 16, 2020

(51) Int. Cl.
| | | |
|---|---|---|
| *H04L 1/00* | (2006.01) | |
| *H03M 13/15* | (2006.01) | |
| *H03M 13/29* | (2006.01) | |
| *G06F 3/06* | (2006.01) | |
| *H03M 13/09* | (2006.01) | |
| *G06F 11/10* | (2006.01) | |

(52) U.S. Cl.
CPC ........ *H03M 13/152* (2013.01); *G06F 3/0679* (2013.01); *G06F 11/1068* (2013.01); *H03M 13/098* (2013.01); *H03M 13/1515* (2013.01); *H03M 13/2927* (2013.01); *H03M 13/2948* (2013.01)

(58) Field of Classification Search
CPC ........... H03M 13/152; H03M 13/1515; H03M 13/2927; H03M 13/098; H03M 13/2948; H03M 13/1545; H03M 13/153; H03M 13/2906; G06F 3/0679; G06F 11/1068
See application file for complete search history.

(56) References Cited

U.S. PATENT DOCUMENTS

| | | | | |
|---|---|---|---|---|
| 8,611,173 | B1 * | 12/2013 | Zhang | G11C 8/16 365/230.02 |
| 8,667,377 | B1 * | 3/2014 | Mazahreh | H03M 13/152 714/784 |
| 9,792,176 | B2 * | 10/2017 | Blaichman | H03M 13/3707 |
| 2004/0177312 | A1 * | 9/2004 | Xin | H03M 13/15 714/782 |
| 2007/0226285 | A1 * | 9/2007 | Goswami | H04L 27/265 708/404 |

(Continued)

*Primary Examiner* — April Y Blair
*Assistant Examiner* — Rong Tang
(74) *Attorney, Agent, or Firm* — F. Chau & Associates, LLC (57) ABSTRACT

A decoding circuit includes a Bose-Chaudhuri-Hocquenghem (BCH) decoder. The BCH decoder includes a Syndrome stage for generating syndromes based on a BCH encoded word, a Berlekamp-Massey (BM) stage performing a Berlekamp-Massey algorithm on the syndromes to generate Error Location Polynomial (ELP) coefficients, a Chien stage that performs a Chien search on the ELP coefficients using a Fast Fourier Transform (FFT) to generate error bits and iteration information, and a Frame Fixer stage configured to reorder the error bits to be sequential based on the iteration information. The BCH decoder decodes the BCH encoded word using the reordered error bits.

18 Claims, 11 Drawing Sheets

(56) References Cited

U.S. PATENT DOCUMENTS

| | | | |
|---|---|---|---|
| 2010/0235709 A1* | 9/2010 | Kowalski | H03M 13/2903 714/752 |
| 2013/0212352 A1* | 8/2013 | Anderson | G06F 9/30065 712/1 |
| 2015/0331741 A1* | 11/2015 | Park | H03M 13/05 714/768 |

* cited by examiner

METHOD AND APPARATUS FOR ENCODING AND DECODING DATA IN MEMORY SYSTEM

BACKGROUND

1. Technical Field

Exemplary embodiments of the present inventive concept relate to methods and apparatuses for encoding and decoding data in a memory system.

2. Discussion of Related Art

NAND flash memory is one example of electrically erasable and programmable read only memory (EEPROM). A NAND flash memory may store large amounts of information in a small chip area by using NAND cell units where a plurality of memory cells are connected in series to each other.

An error may arise when data is stored at a memory device and stored data is read from the memory device. Various error correction codes may be used to detect and correct such errors. The error correction codes may include a Reed-Solomon (RS) code, a Bose-Chaudhuri-Hocquenghem (BCH) code, a Low Density Parity Check (LDPC) code, and so on.

SUMMARY

According to an exemplary embodiment of the inventive concept, a decoding circuit including a Bose-Chaudhuri-Hocquenghem (BCH) decoder is provided. The BCH decoder includes a Syndrome stage for generating syndromes based on a BCH encoded word, a Berlekamp-Massey (BM) stage performing a Berlekamp-Massey algorithm on the syndromes to generate Error Location Polynomial (ELP) coefficients, a Chien stage that performs a Chien search on the ELP coefficients using a Fast Fourier Transform (FFT) to generate error bits and iteration information, and a Frame Fixer stage configured to reorder the error bits to be sequential based on the iteration information. The BCH decoder decodes the BCH encoded word using the reordered error bits.

According to an exemplary embodiment of the inventive concept, a method of decoding a Bose-Chaudhuri-Hocquenghem (BCH) encoded word is provided. The method includes: generating syndromes based on the BCH encoded word; performing a Berlekamp-Massey algorithm on the syndromes to generate Error Location Polynomial (ELP) coefficients; performing a Chien search on the ELP coefficients using a Fast Fourier Transform (FFT) to generate error bits and iteration information; reordering the error bits to be sequential based on the iteration information; and decoding the BCH encoded word using the reordered error bits.

According to an exemplary embodiment of the inventive concept, a decoding circuit including a Bose-Chaudhuri-Hocquenghem (BCH) decoder is provided. The BCH decoder includes: a Syndrome stage for generating syndromes based on a BCH encoded word; a Berlekamp-Massey (BM) stage performing a Berlekamp-Massey algorithm on the syndromes to generate Error Location Polynomial (ELP) coefficients; a first Fast Fourier Transform (FFT) stage iteratively performing a first FFT operation on the ELP coefficients to generate first results; a second FFT stage iteratively performing a second FFT operation on the first results to generate second results; and a logic circuit configured to generate the error bits from the second results. The BCH decoder decodes the BCH encoded word using the error bits.

BRIEF DESCRIPTION OF THE DRAWINGS

The present inventive concept will become more apparent by describing in detail exemplary embodiments thereof with reference to the attached drawings, in which.

DETAILED DESCRIPTION

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., nonvolatile memories universal flash memories, universal flash memory controllers, nonvolatile memories and memory controllers, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

Figure 1:
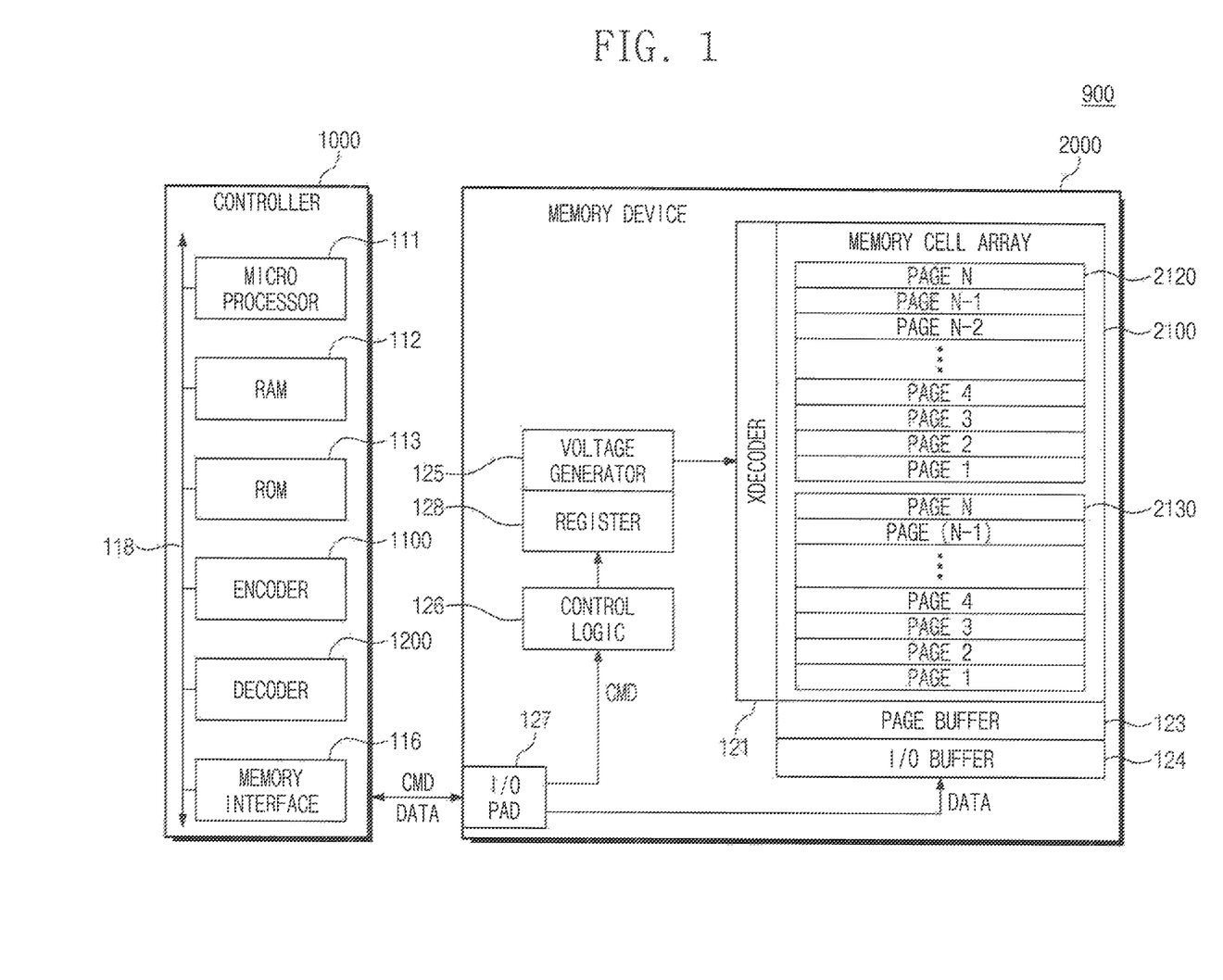
FIG. 1 illustrates a diagram showing a memory system according to an exemplary embodiment of the inventive concept.

FIG. 1 is a block diagram of a memory system to which a memory according to some embodiments of the present inventive concept is applied. Referring to FIG. 1, the memory system 900 includes the memory controller 1000 and a nonvolatile memory device 2000.

The nonvolatile memory device 2000 may be, but is not limited to, a flash memory device, a NAND flash memory device, a phase change RAM (PRAM), a ferroelectric RAM (FRAM), a magnetic RAM (MRAM), etc. According to at least one example embodiment of the inventive concepts, the nonvolatile memory device 2000 may include a plurality of NAND flash memory devices. The nonvolatile memory device 2000 may have a planar structure or a three-dimensional (3D) memory cell structure with a stack of memory cells.

The nonvolatile memory device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

The memory cell array 2100 includes a plurality of word lines W/L and a plurality of bit lines B/L. Each memory cell of the memory cell array 2100 may be implemented as a nonvolatile memory cell. For example, each memory cell of the memory cell array 2100 may have, for example, a floating gate or a charge storage layer such as a charge trapping layer.

The memory cell array 2100 may include a plurality of blocks and a plurality of pages. One block includes a plurality of pages. A page may be a unit of program and read operations, and a block may be a unit of erase operation. For example, the memory cell array 2100 includes a first block 2120 and a second block 2130. As is illustrated in FIG. 1, the first block 2120 includes pages 1-N, and the second block 2130 includes pages 1-N, where N is a positive integer greater than 1.

The control logic 126 controls the overall operation of the nonvolatile memory device 2000. When receiving a command CMD from the memory controller 1000, the control logic 126 interprets the command CMD and controls the nonvolatile memory device 2000 to perform an operation (e.g., a program operation, a read operation, a read retry operation, or an erase operation) according to the interpreted command CMD.

The X decoder 121 is controlled by the control logic 126 and drives at least one of the word lines W/L in the memory cell array 2100 according to a row address.

The voltage generator 125 is controlled by the control logic 126 to generate one or more voltages required for a program operation, a read operation or an erase operation and provide the generated voltages to one or more rows selected by the X decoder 121.

A register 128 is a space in which information input from the memory controller 1000 is stored and may include a plurality of latches. For example, the register 128 may group read voltage information and store the information in the form of a table.

The page buffer 123 is controlled by the control logic 126 and operates as a sense amplifier or a write driver according to an operation mode (e.g., a read operation or a program operation).

The I/O pad 127 and the I/O buffer 124 may serve as I/O paths of data exchanged between an external device, e.g., the memory controller 1000 or a host and the nonvolatile memory device 2000.

The memory controller 1000 may include a microprocessor 111, a read-only memory (ROM) 113, a random access memory (RAM) 112, an encoder 1100, a decoder 1200, a memory interface 116, and a bus 118. The elements 111 through 116 of the memory controller 1000 may be electrically connected to each other through the bus 118.

The microprocessor 111 controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to at least one example embodiment of the inventive concepts, the microprocessor 111 may also issue instructions for controlling operations of other elements of the memory controller 1000 including, for example, some or all of the ROM 113, RAM 112, encoder 1100, decoder 1200, memory interface 116, and a bus 118. According to at least one exemplary embodiment of the inventive concept, any operations described herein as being performed by the memory controller 1000 may be performed by, or under the control of, the microprocessor 111. According to at least one exemplary embodiment of the inventive concept, any operations described herein as being performed by the memory controller 1000 may be performed by, or under the control of, the microprocessor 111 executing instructions that correspond to the operations and are included in program code (e.g., stored in the ROM 113).

While a driving firmware code of the memory system 900 is stored in the ROM 113, one or more example embodiments of the inventive concepts are not limited thereto. The firmware code can also be stored in a portion of the nonvolatile memory device 2000 other than the ROM 113. Therefore, the control or intervention of the microprocessor 111 may encompass not only the direct control of the microprocessor 111 but also the intervention of firmware which is software driven by the microprocessor 111.

The RAM 112, which is a memory serving as a buffer, may store an initial command, data, and various variables input from a host or the microprocessor 111, or data output from the nonvolatile memory device 2000. The RAM 112 may store data and various parameters and variables input to and output from the nonvolatile memory device 2000.

The memory interface 116 may serve as an interface between the memory controller 1000 and the nonvolatile memory device 2000. The memory interface 116 is connected to the I/O pad 127 of the nonvolatile memory device 2000 and may exchange data with the I/O pad 127. In addition, the memory interface 116 may create a command suitable for the nonvolatile memory device 2000 and provide the created command to the I/O pad 127 of the nonvolatile memory device 2000. The memory interface 116 provides a command to be executed by the nonvolatile memory device 2000 and an address ADD of the nonvolatile memory device 2000.

According to at least one exemplary embodiment of the inventive concept, the decoder 1200 may be an error correcting code (ECC) decoder, and the encoder 1100 may be an ECC encoder. According to at least one exemplary embodiment of the inventive concept, the decoder 1200 and the encoder 1100 perform error bit correction. The encoder 1100 may generate data added with one or more parity and/or redundancy bits by performing error correction encoding on data before the data is provided to the nonvolatile memory device 2000. The one or more parity and/or redundancy bits may be stored in the nonvolatile memory device 2000.

The decoder 1200 may perform error correction decoding on output data, determine whether the error correction decoding is successful based on the result of the error correction decoding, and output an instruction signal based on the determination result. Read data may be transmitted to the decoder 1200, and the decoder 1200 may correct error bits of the data using the one or more parity and/or redundancy bits. When the number of error bits exceeds a limit of error bits that can be corrected, the decoder 1200 cannot correct the error bits, resulting in an error correction failure. In an exemplary embodiment, the encoder 1100 and the decoder 1200 perform error correction using Super Bose-Chaudhuri-Hocquenghem (SBCH).

SBCH is a multilevel algebraic code comprised of several short binary Bose-Chaudhuri-Hocquenghem (BCH) codes and non-binary Reed-Solomon (RS) codes. As opposed to the message-passing decoding algorithm of low density parity check (LDPC) codes, which requires iteratively interchanging large amounts of soft information between variable and check nodes, the decoding algorithm for SBCH codes is entirely algebraic, using standard algebraic decoding modes for the short component BCH and RS codes. For this reason, the power consumption of an SBCH decoder is considerably smaller than that of the corresponding LDPC decoder.

Figure 2A:
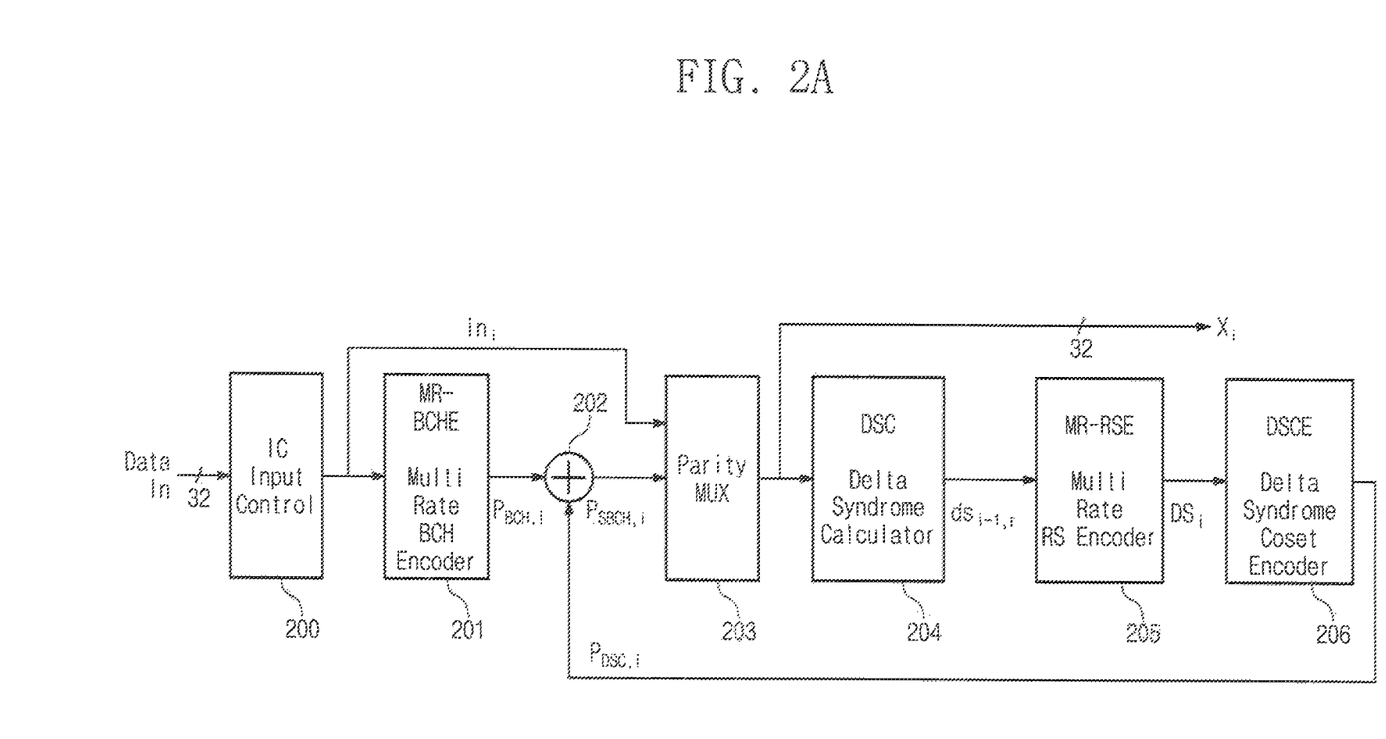
FIG. 2A illustrates a high-level block diagram of an SBCH encoder according to an exemplary embodiment of the inventive concept.

FIG. 2A illustrates a high-level block diagram of an SBCH encoder, which may be used to implement the encoder 1100 of FIG. 1.

The SBCH encoder includes an input control block 200 (e.g., an input control circuit) configured to receive a certain amount of data bits to encode. For example, the input control block illustrated in FIG. 2A is configured to receive 32 bits of input data from an input data bus periodically. The input control block 200 applies the input data as an information part $in_i$ to a BCH encoder 201 (e.g., a systematic BCH encoder) and a multiplexer 203.

The BCH encoder 201 performs a BCH encoding on each input information part (e.g., $in_{i-1}$, $in_i$, $in_{i+1}$, etc.). The BCH encoder 201 may support multiple BCH code rates, with fixed code length n and a different number of parity bits. The BCH encoding results in generation of BCH parity parts (e.g., $P_{BCH,i-1}$, $P_{BCH,i}$, $P_{BCH,i+1}$, etc.).

The SBCH encoder further includes an adder (e.g., an adding circuit) 202 that generates SBCH parity (e.g., $P_{SBCH,i-1}$, $P_{SBCH,i}$, $P_{SBCH,i+1}$, etc.) by adding a BCH parity part (e.g., $P_{BCH,i}$) to a delta-syndrome coset parity $P_{DSCi}$ output by a Delta Syndrome Coset Encoder 206 of the SBCH encoder. The Delta Syndrome Coset Encoder 206 generates a delta-syndrome coset parity (e.g., $P_{DSCi}$) by performing an encoding operation on a delta-syndrome coset $DS_i$, which is generated from prior delta-syndrome values $ds_{i-1,r}$ generated from a prior input information part $in_{i-1}$.

The Multiplexer 203 combines a current information part (e.g., $in_i$) with the SBCH parity (e.g., $P_{SBCH,i}$) to generate a current frame $x_i$ (e.g., a BCH code word), which is outputted at a certain rate (e.g., 32 bits per cycle).

A Delta Syndrome Calculator 204 of the SBCH encoder was operated on the prior input information part $in_{i-1}$ and the prior SBCH parity $P_{SBCH,i-1}$ to generate the prior delta-syndrome values $ds_{i-1,r}$, which may be generated in a similar manner to the current delta-syndrome $ds_{i,r}$ according to below Equation 1.

$$ds_{i,r} = \sum_{j=0}^{n-1} x_{i,j} \cdot \alpha^{j \cdot (2 \cdot (t_0 + r) - 1)}$$ [Equation 1]

An RS encoder 205 of the SBCH encoder calculates RS parity symbols from the prior delta-syndrome values $ds_{i-1,r}$, which define the delta-syndrome coset $DS_i$.

The SBCH encoder continues frame by frame until all the information parts have been processed. For example, if the information parts total to 4 KB, then the SBCH encoder adds 472 bytes of additional parity data to create a result that includes multiple BCH codes.

Figure 2B:
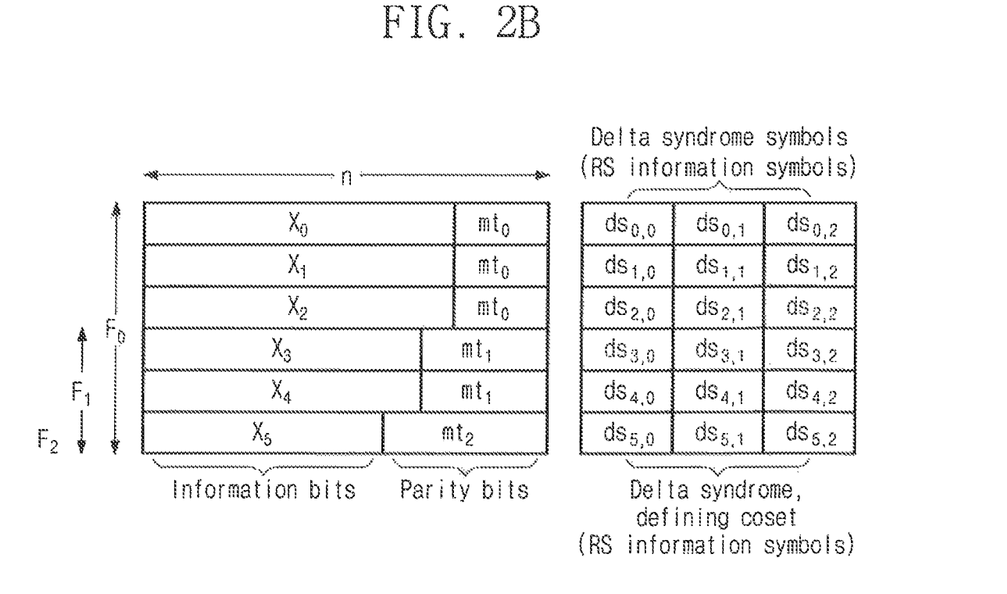
FIG. 2B illustrates encoded data that may be output by the SBCH encoder.

FIG. 2B illustrates an example of data encoded by the SBCH encoder of FIG. 2A. Each row of the data shown in FIG. 2B is a frame.

Figure 3:
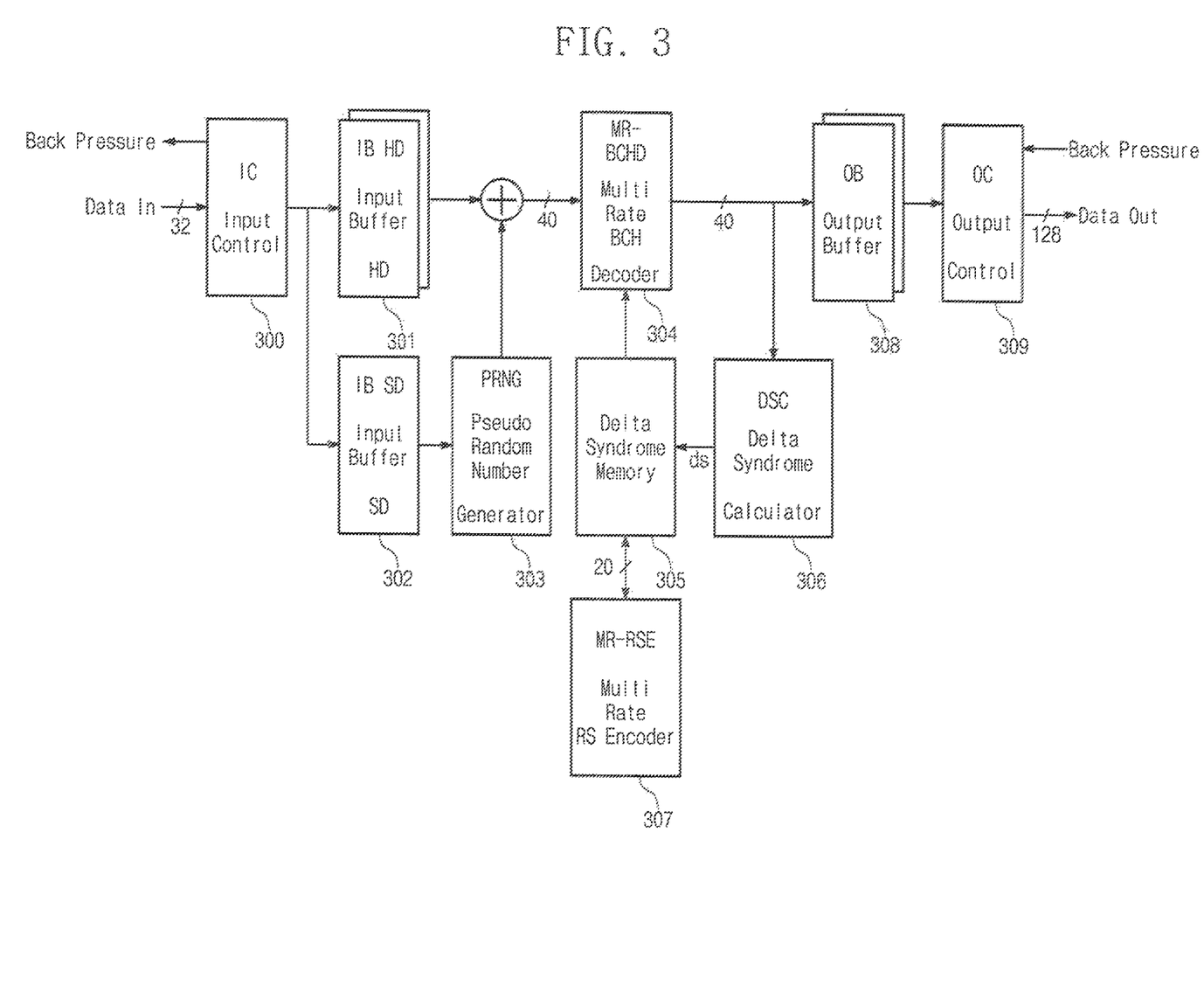
FIG. 3 is illustrates a high-level block diagram of an SBCH decoder according to an exemplary embodiment of the inventive concept.

FIG. 3 is illustrates a high-level block diagram of an SBCH decoder, which may be used to implement the decoder 1200 of FIG. 1.

The input to the decoder may be a SBCH encoded word read from a memory (e.g., a NAND such as memory device 2000). The bits of the SBCH encoded word may be referred to as hard decision bits. The input to the decoder may also include soft information (e.g., soft decision bits) from the memory, which includes information on the reliability of each bit. When the SBCH decoder fails, it is possible to read from the soft decision bits.

An input control block (e.g., an input control circuit) 300 of the decoder applies the hard decision bits to a hard decision buffer 301 of the decoder. If soft decision bits are available, the input control block 300 applies them to a soft decision buffer 302 of the decoder. A BCH decoder 304, (e.g., a multi-rate BCH decoder) of the decoder reads data from the hard decision buffer 301 at a certain rate (e.g., 40 bits per cycle) and decodes the frames with a certain correction capability. As part of the BCH decoding, the BCH decoder 304 also reads delta-syndromes $ds_{i,p}$ (p=0 . . . r) from a delta syndrome memory 305 of the decoder. The results of the BCH decoding by the BCH decoder 304 are written to an output buffer 308 at a certain rate (e.g., 40 bits per cycle).

Frames that were decoded successfully by the BCH decoder 304 are applied to a Delta-Syndrome Calculator 306 of the decoder, which calculates all the delta-syndromes $ds_{i,r}$ and writes them into the delta syndrome memory 305.

Once the BCH decoder phase is terminated, according to the decoding flow, the required delta syndromes from the delta syndrome memory 305 are read and applied to an RS decoder 307 of the decoder. In an embodiment, the RS encoder 307 processes (e.g., corrects) 2 delta-syndromes per cycle and writes the corrected delta-syndrome results back to the delta syndrome memory 305.

Once decoding is terminated, the corrected code word (including the parity bits) appears in the output buffer 308. The output control block 309 (e.g., an output control circuit) may read from the output buffer 308 and output the original data (e.g., the 4K information) at a certain rate.

When the soft decision bits are read from memory, they are stored in the soft decision buffer 302. The SBCH decoder 304 reads the soft decision bits from the soft decision buffer 302, and for bits with low reliability, it flips the word bits (read from the hard decision buffer 301) with some probability, controlled by the pseudo random (or random) number generator 303.

Figure 4:
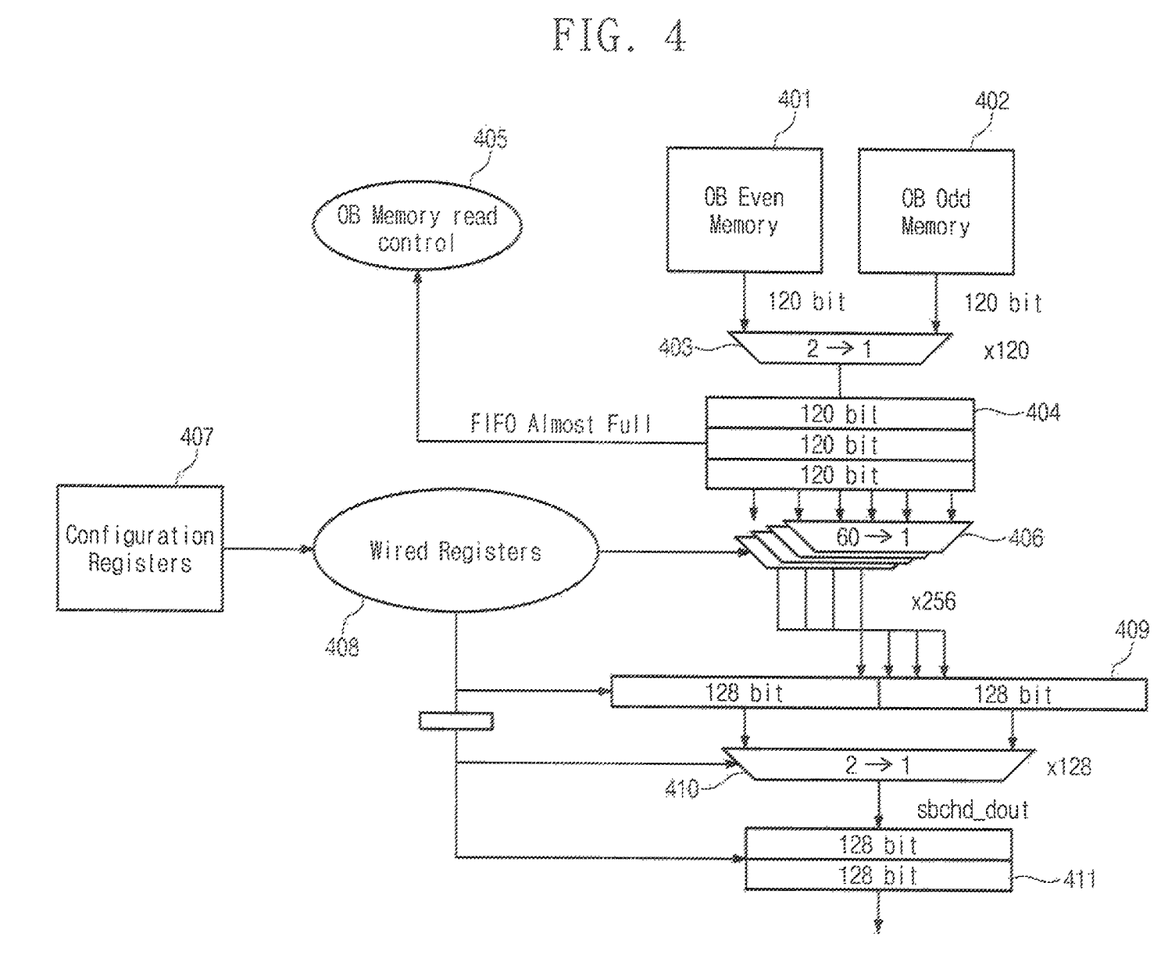
FIG. 4 illustrates an output buffer according to an exemplary embodiment of the inventive concept that may be used in the SBCH decoder.

FIG. 4 illustrates the output buffer 308 of the SBCH decoder FIG. 3 according to an exemplary embodiment of the inventive concept.

The output buffer of FIG. 4 includes an Even memory 401, an Odd memory 402, first multiplexers 403 (e.g., 2 to 1 multiplexers), a first first-in-first-out (FIFO) buffer 404, a plurality of second multiplexers 406 (e.g., 60 to 1 multiplexers), a buffer 409, third multiplexers 410 (e.g., 2 to 1 multiplexers), and a second FIFO 411. The BCH decoder 304 outputs a first amount of data (e.g., 40 bits) to the output buffer. Each row of the Even Memory 401 and each row of the Odd memory 402 store 3 times the first amount (e.g., 120 bits). The Even Memory 401 and the Odd memory 402 each include multiple rows. For ease of discussion, it is assumed that the first amount is 40 bits, but the inventive concept is not limited thereto.

Thus, the BCH decoder 304 can output 40 bit chunks to the Even Memory 401 three times to fill up one of its rows, and continue this process until the Even Memory 401 is full. Then after filling up the Even Memory 401, the BCH decoder 304 keeps outputting 40 bit chunks until the Odd Memory 402 is full. Thus, the BCH decoder 304 can then switch back and forth between outputting data to the Even Memory 401 and the Odd Memory 402.

The first multiplexers 403 are configured to output 120 bits (i.e., 3 times the first amount of data output by the BCH decoder) from one of the Even Memory 401 and the Odd Memory 402 to the first FIFO 404. For example, the first multiplexers 403 can alternate between outputting data from the Even Memory 401 and the Odd Memory 402. For example, there may be 120 2 to 1 first multiplexers 403, where each of the first multiplexers 403 receives one bit of the Even Memory 401 and one bit of the Odd Memory 402.

The output buffer may include circuitry that determines when the first FIFO 404 is full or almost full (e.g., has a number of empty cells less than a threshold). The output buffer may include a read control circuit 405 that receives a control signal indicating whether the first FIFO 404 is full or almost full. For example, the read control circuit 405 could send a signal to the BCH decoder 304 informing the BCH decoder 304 to hold off sending new data when the first FIFO 404 is full.

The second multiplexers 406 include a number (e.g., 256) of multiplexers which each receive a different half (e.g., 60 bits) of the available bits (e.g., 120 bits) output by the first FIFO 404, and only output one of the received bits. For example, when each cell of the first FIFO 404 is 120 bits, the second multiplexers 406 are 60 to 1 multiplexers. The second multiplexers 406 may be controlled by wired registers 408, which may be controlled by configuration registers 407.

The buffer 409 receives data output by the second multiplexers 406. The width of the buffer 409 corresponds to the number of bits output by the second multiplexers 406. For example, when there are 256 second multiplexers 406, the width of the buffer 409 is 256 bits. The wired registers 408 may control the second multiplexers 406 to output a first half of its output data (e.g., 128 bits) to the first half (first part) of the buffer 409 and the second half of its output data to the second half (second part) of the buffer 409.

Each of the third multiplexers 410 receives two different bits of the output buffer 409 and outputs only one of the received bits to the second FIFO 411, which eventually outputs the received data to the Output Control Block 309. For example, first data received from the third multiplexers 410 is moved to a first cell of the second FIFO 411, the first data is moved to a second cell of the second FIFO 411 and second data received from the third multiplexers 410 is moved to the first cell, etc. When the second FIFO 411 is full, the next time data is received from the third multiplexers 410, the data of the last cell of the second FIFO 411 can be output to the Output Control Block 309.

Figure 5:
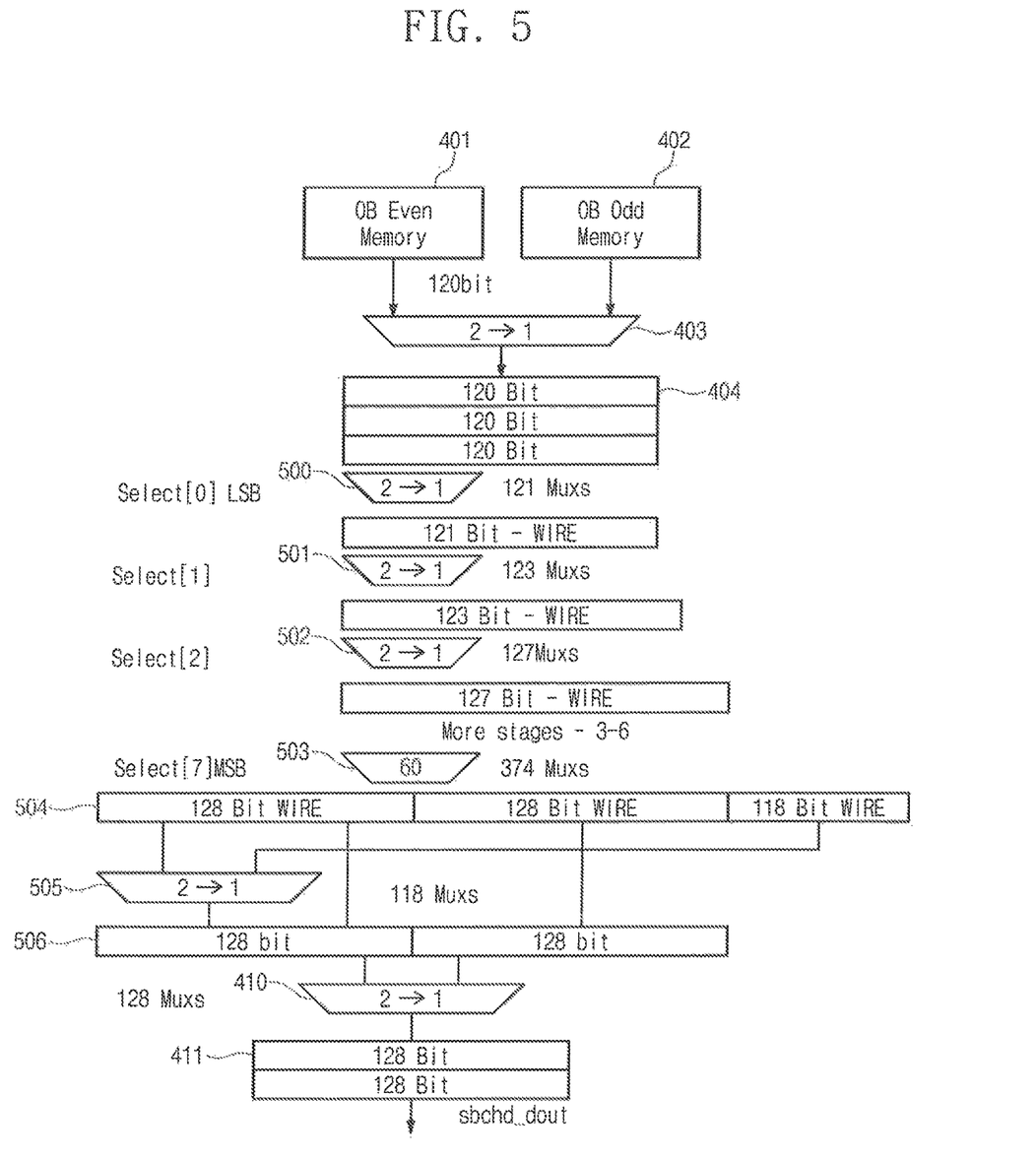
FIG. 5 illustrates an output buffer according to an exemplary embodiment of the inventive concept that may be used in the SBCH decoder.

FIG. 5 illustrates the output buffer 308 of the SBCH decoder of FIG. 3 according to an exemplary embodiment of the inventive concept.

The output buffer of FIG. 5 has some of the same elements as the output buffer of FIG. 4, such as the Even Memory 401, the Odd Memory 402, the first multiplexers 403, the first FIFO 404, the third multiplexers 410, and the second FIFO 411. The output buffer additionally includes 2 to 1 multiplexers 500/501/502, 60 to 1 multiplexers 503, buffer 504, 2 to 1 multiplexers 505, and buffer 506.

The multiplexers 500 include one more multiplexer than the bit width of the first FIFO 404, the multiplexers 501 include three more multiplexers than the bit width of the first FIFO 404, the multiplexers 502 include seven more multiplexers than the bit width of the first FIFO 404, and the multiplexers 503 include more multiplexers than the bit width of the first FIFO 404. For example, when the bit width is 120 bits, there are 121 multiplexers 500, 123 multiplexers 501, 127 multiplexers 502, and 374 multiplexers 503.

Each of Multiplexers 500 receive a different 2 bits output by the first FIFO 404, and output only 1 of the received bits to output a 121 bit output. Each of Multiplexers 501 receive a different 2 bits output by Multiplexers 500, and output only 1 of the received bits to output a 123 bit output. Each of Multiplexers 502 receive a different 2 bits output by Multiplexers 501, and output only 1 of the received bits to output a 127 bit output. Each of Multiplexers 503 receive a different 60 bits of the 127 bit output, and output only 1 of the received bits to output 374 bits to buffer 504.

Buffer 504 includes a first portion (e.g., 128 bits), a second portion (e.g., 128 bits), and a third portion (e.g., 118 bits). Each of the 2 to 1 Multiplexers 505 receives one bit of the first portion and one bit of the third portion and output only 1 of the received bits to output 118 bits to a first part of buffer 506. The remaining bits of the first portion (e.g., 10 bits) are copied to the end of the first part of buffer 506. The second portion of the buffer 504 is copied to the second part of buffer 506. Each of the 2 to 1 Multiplexers 507 receives two bits of buffer 506 and only outputs one of the received bits to output 128 bits to the second FIFO 411.

Figure 6:
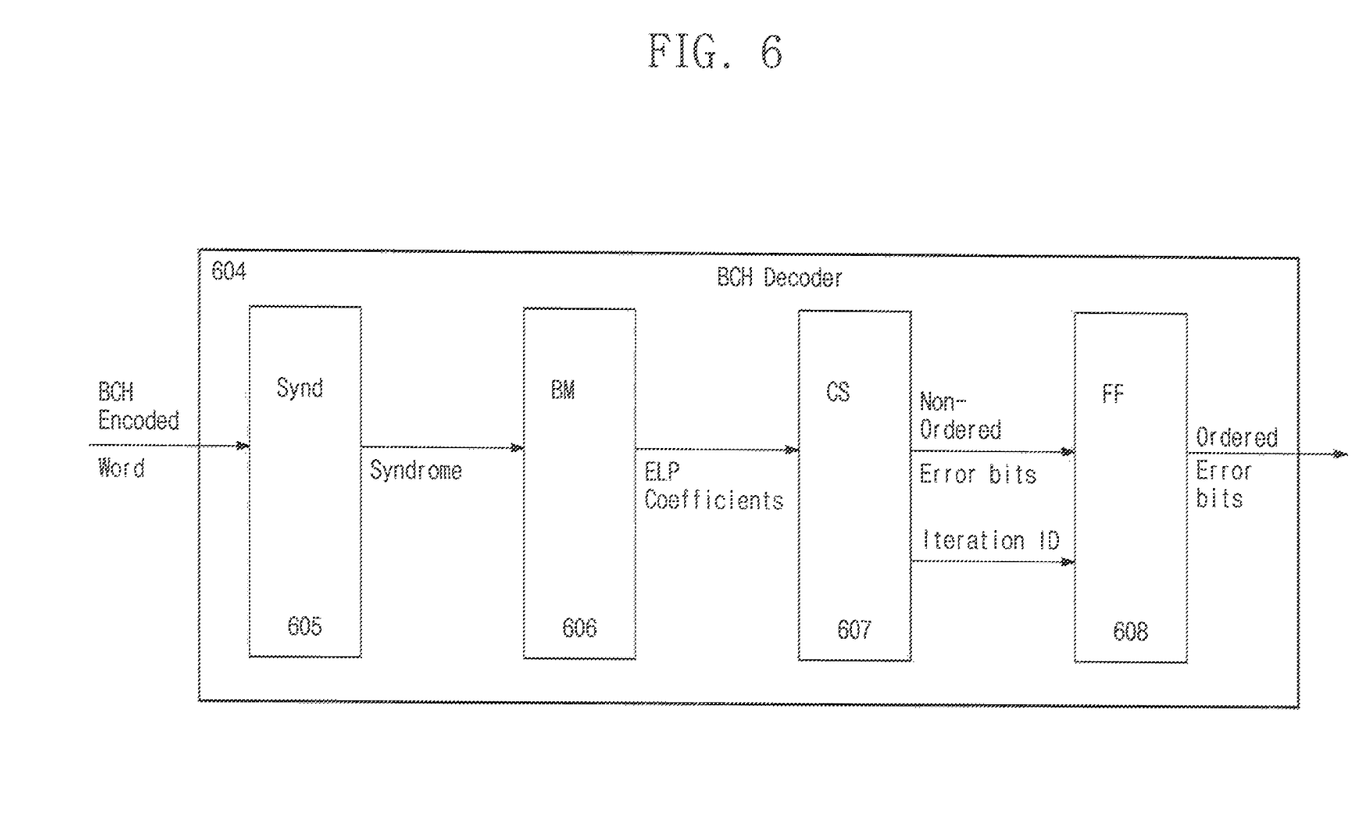
FIG. 6 illustrates a BCH decoder of the SBCH encoder according to an exemplary embodiment of the inventive concept.

FIG. 6 illustrates a BCH decoder 604 according to an exemplary embodiment of the inventive concept, which can be used to implement the BCH decoder 304 of FIG. 3. Referring to FIG. 6, the BCH decoder 604 includes a Syndrome stage 605, a Berlekamp-Massey (BM) stage 606, a Chien Search (CS) stage 607, and a Frame Fixer stage 608. The Syndrome stage 605 generates 't' syndromes from encoded data such as a BCH encoded word, where 't' is the number of errors that can be corrected. The BM stage 606 performs a Berlekamp-Massey algorithm on an output (syndromes) of the Syndrome stage 605. The BM stage 606 iteratively builds 2 polynomials, the Error Location Polynomial (ELP) and the Auxiliary Polynomial (AP). The CS stage 607 performs a Chien Search that is modified to use a Fast Fourier Transform (FFT) on ELP coefficients output by the BM stage 606. The CS stage 607 outputs error bit data and iteration ID data or iteration information. For example, if the decoded data has 40 bits, then the error bit data would indicate whether each of the bits of the decoded data has an error. For example, if the first bit of the decoded data has an error and the second bit of the decoded data does not have an error, the first bit of the error bit data would be 1 and the second bits of the error bit data would be 0. The error bit data output by a conventional CS stage is sequentially ordered. However, the error bit data output by the CS Stage 607 is not sequentially ordered. The Frame Fixer Stage 608 is configured to reorder the error bits so they are sequential using the Iteration ID data.

Figure 7:
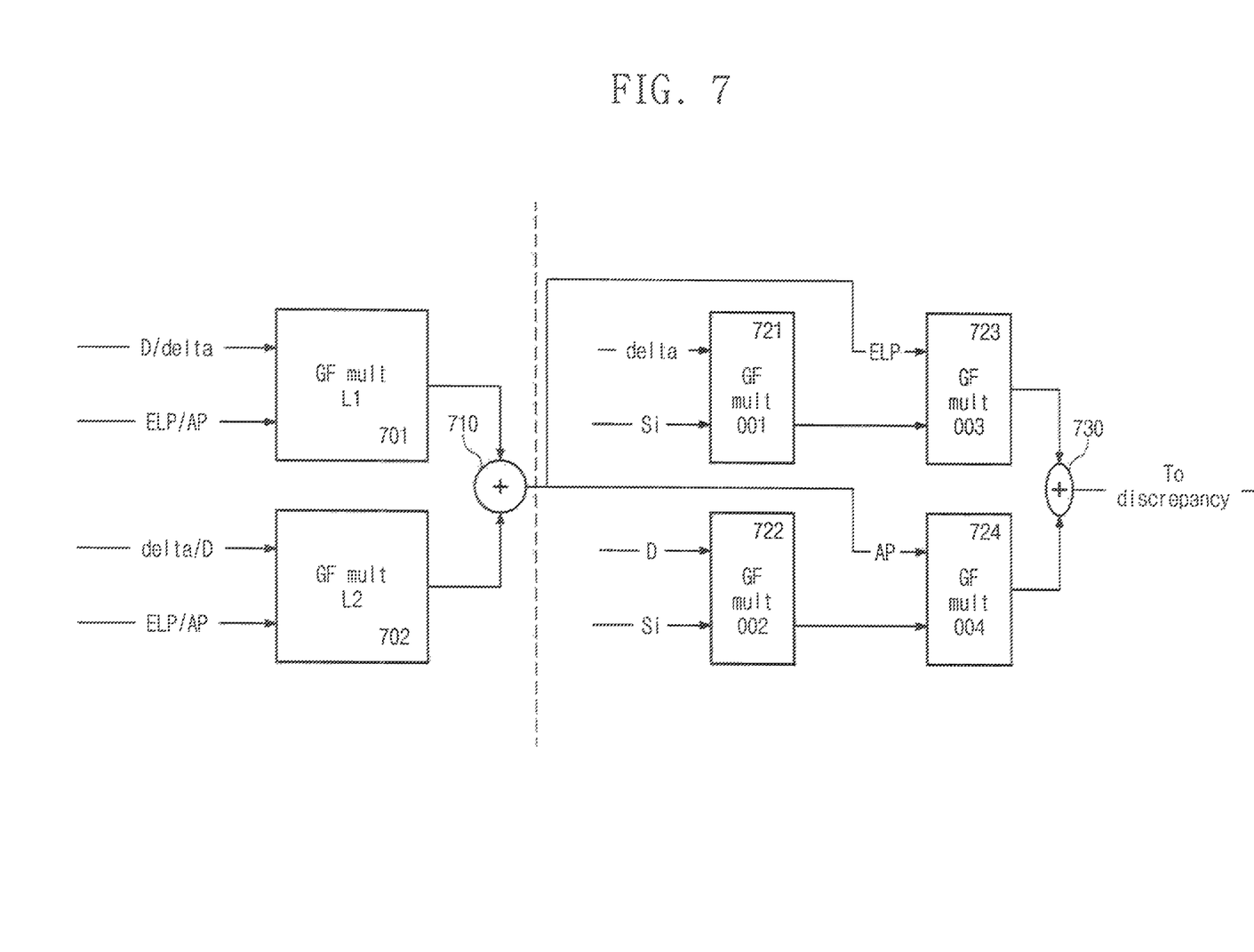
FIG. 7 illustrates a BM stage of the BCH decoder according to an exemplary embodiment of the inventive concept.

FIG. 7 illustrates a BM stage according to an exemplary embodiment of the inventive concept, which can be used to implement the BM stage 606 of FIG. 6. The BM stage of FIG. 7 includes a pair of multipliers 701 and 702, four multipliers 721, 722, 723, and 724, a first adder 710 and a second adder 730. Multiplier 701 receives inputs D and delta, and inputs ELP (e.g., an error location polynomial) and AP (e.g., an auxiliary polynomial). The D is a discrepancy calculated by the BM stage 606 and the delta is the previous value of D. Multiplier 702 receives inputs D and delta, and inputs ELP and AP. The first adder 710 sums the outputs of multipliers 701 and 702 and provides the sum as input to multipliers 723 and 724. The Multipliers 701 and 702 are Galois Field multipliers. Multiplier 721 receives inputs of delta and Si, multiplies the received inputs, and provides the result to multiplier 723. Multiplier 722 receives inputs of D and Si, multiplies the received inputs, and provides the result to multiplier 724. Multiplier 723 multiplies ELP by the output of multiplier 721. Multiplier 724 multiplies AP by the output of Multiplier 722.

The second adder 730 sums an output of multipliers 723 and 724 to generate discrepancy values for output to the CS stage 607.

Figure 8:
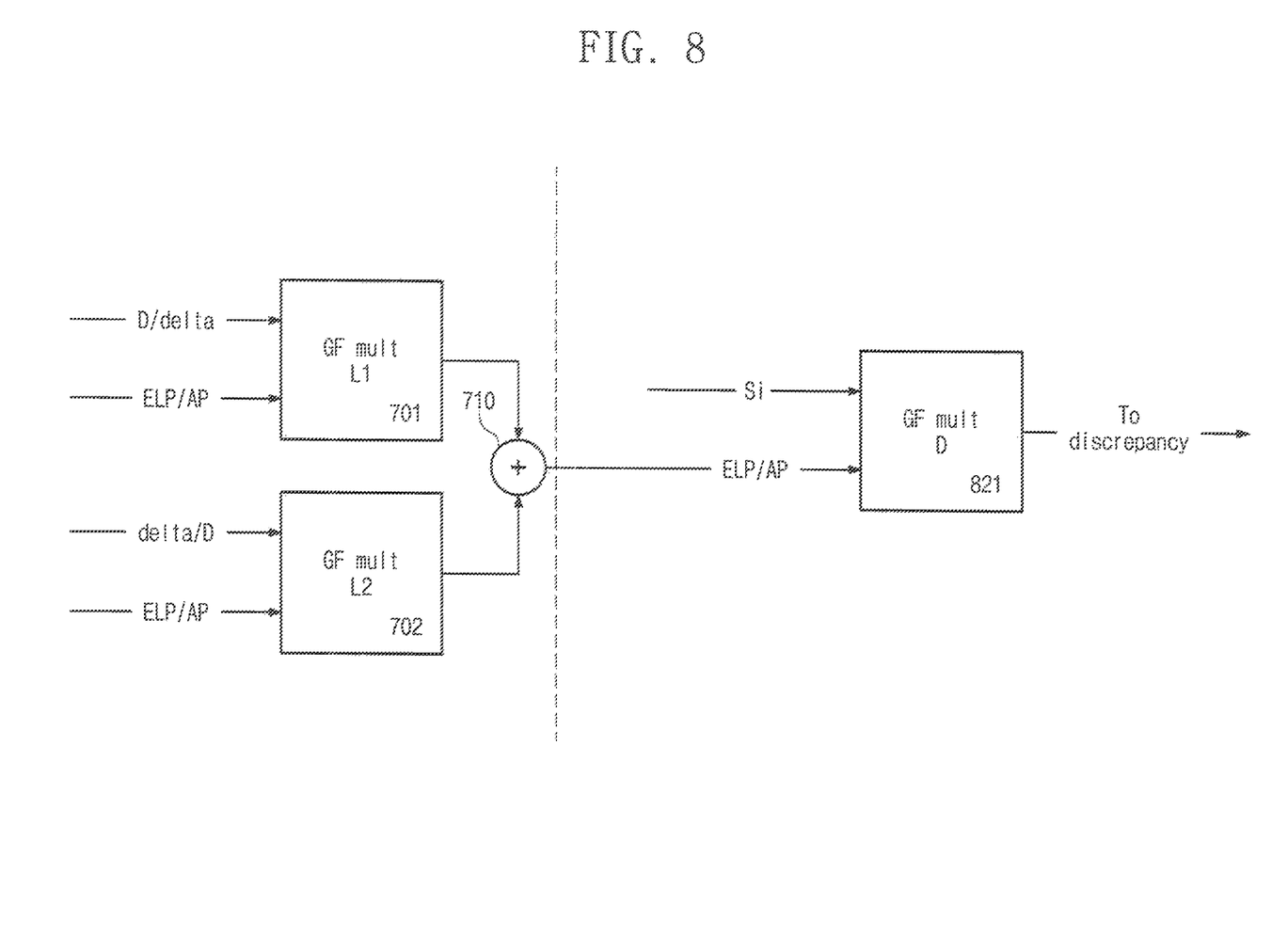
FIG. 8 illustrates a BM stage of the BCH decoder according to an exemplary embodiment of the inventive concept.

FIG. 8 illustrates a BM stage according to an exemplary embodiment of the inventive concept, which can be used to implement the BM stage 606 of FIG. 6. The BM stage of FIG. 8 includes some of the same components as the BM stage of FIG. 7 such as the first and second multipliers 701 and 702, and the first adder 710. The BM stage of FIG. 8 includes a multiplier 821 receiving an Si input (i.e., the i-th syndrome) and one of an ELP and an AP input from the first adder 710. The Multiplier 821 multiplies Si by ELP and/or Si by AP to generate discrepancy values for output to the CS stage.

FIG. 7 and FIG. 8 provide inversionless versions of the BM stage 606. The inversionless version requires two multipliers: one for multiplying ELP by D (e.g., 701) and one for multiplying AP by delta (e.g., 702). In a non-inversionless version of the BM stage 606, only one such multiplier of scalar by polynomial is required, and a scalar by scalar multiplier is added that requires less power.

In an embodiment, in the non-inversionless version, the first coefficient of the ELP is always 1, which is good for both power conservation and improving a Chien Search. The non-inversionless implementation takes less power than the inversionless, but it requires more area because of the inversion.

Figure 9:
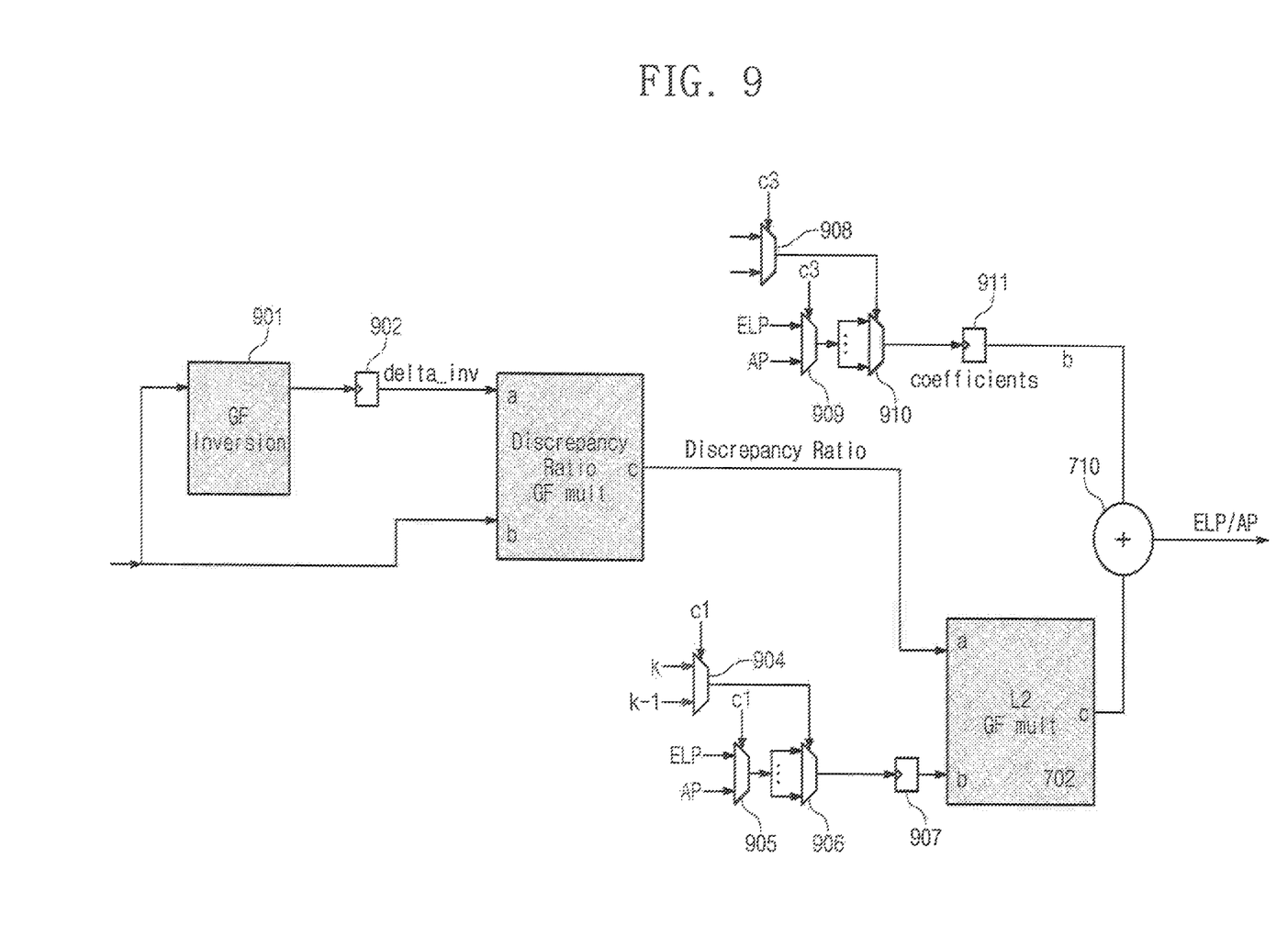
FIG. 9 illustrates a part of the BM stage according to an exemplary embodiment of the inventive concept.

FIG. 9 illustrates a part of a non-inversionless version of the BM stage 606 according to an exemplary embodiment of the inventive concept. For example, the components left of the dotted line in FIG. 8 are replaced by FIG. 9. Referring to FIG. 9, the part includes an inverter 901, a multiplier 903, the multiplier 702 of FIG. 8, multiplexers 904, 905, 906, 908, 909, and 910, and D-flip flops 902, 907 and 911. Multiplexer 904 receives syndromes K and k-1.

Figure 10:
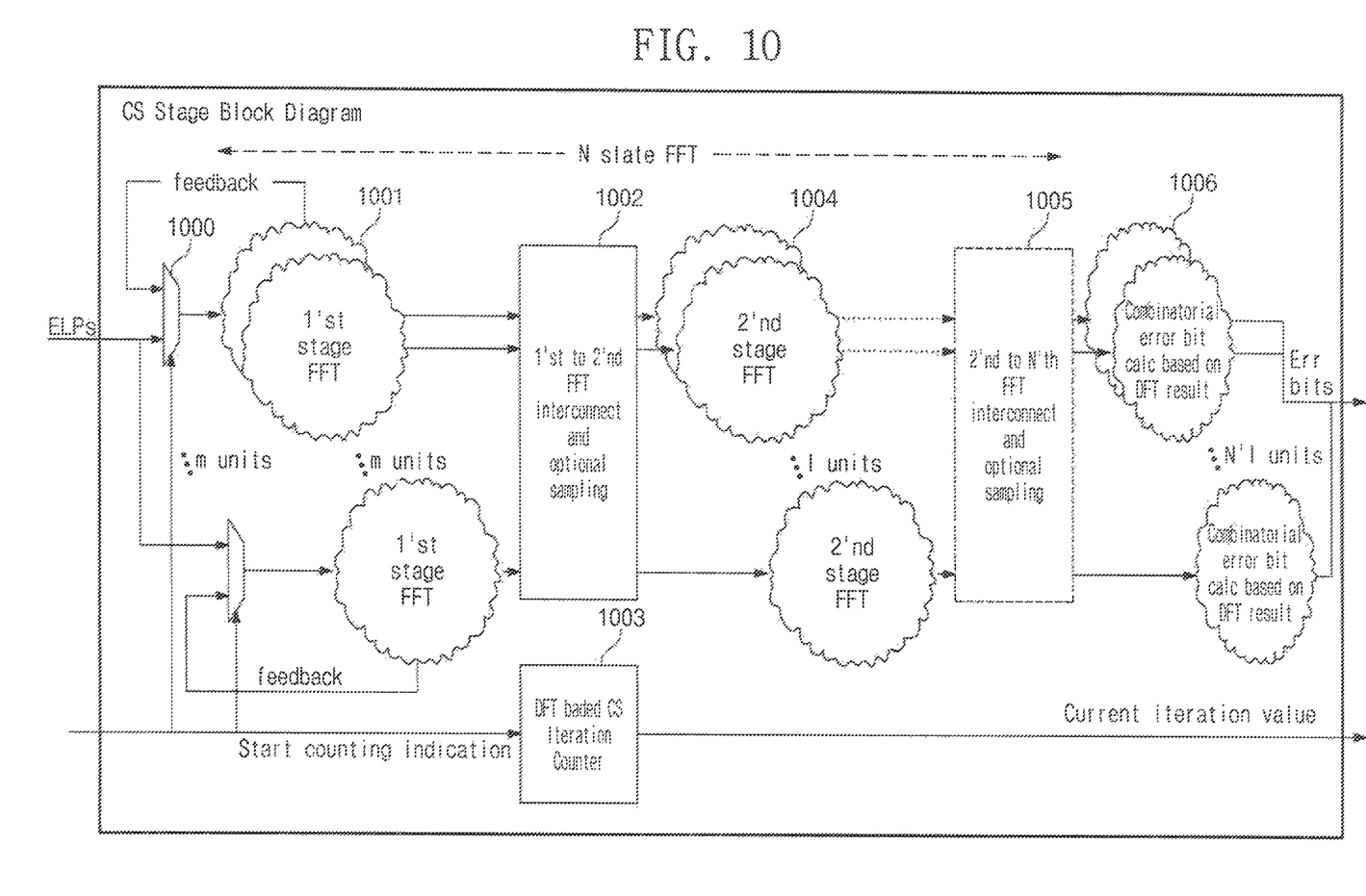
FIG. 10 illustrates a CS stage of the BCH decoder according to an exemplary embodiment of the inventive concept.

FIG. 10 illustrates a CS Stage according to an exemplary embodiment of the inventive concept, which may be used to implement the CS Stage 607 of FIG. 6. The CS Stage receives ELP coefficients as inputs from the BM Stage 606. The CS stage includes a $1^{st}$ FFT stage 1001 that performs a first iterative FFT operation on an output of multiplexer 1000. Each iteration of the first iterative FFT operation generates a result that is provided as feedback. The multiplexer 1000 chooses between outputting a next one of the ELP coefficients and the feedback based on a Start Counting Indication. An Iteration Counter 1003 is incremented each time an iteration of the $1^{st}$ FFT stage is performed.

The BM Stage 606 may provide the Start Counting Indication. The results of the first iterative FFT operation are provided to a first sampling device 1002 that samples the results, and provides the sampled results to a $2^{nd}$ FFT stage 1004. The $2^{nd}$ FFT stage 1004 performs a second iterative FFT operation on the sampled results output by the sampling device 1002. The results of the $2^{nd}$ iterative FFT operation are provided to a second sampling device 1005. Logic 1006 operates on the sampled results output by the second Sampling device 1005 to calculate the Error bits.

Although the present inventive concept has been described in connection with exemplary embodiments thereof, those skilled in the art will appreciate that various modifications can be made to these embodiments without substantially departing from the principles of the present inventive concept.

What is claimed is:

1. A decoding circuit for performing an error correction in a memory system, the decoding circuit comprising:
a Bose-Chaudhuri-Hocquenghem (BCH) decoder comprising:
a Syndrome stage for generating syndromes based on a BCH encoded word stored in the memory system;
a Berlekamp-Massey (BM) stage performing a Berlekamp-Massey algorithm on the syndromes to generate Error Location Polynomial (ELP) coefficients;
a Chien stage that performs a Chien search on the ELP coefficients using a Fast Fourier Transform (FFT) circuit to generate error bits and iteration information, wherein the Chien stage includes a first FFT stage operating on the ELP coefficients and a counter, and
a Frame Fixer stage configured to reorder the error bits to be sequential based on the iteration information output from the counter incremented for each iteration of the first FFT stage,
wherein the BCH decoder performs the error correction on data of the BCH encoded word using the reordered error bits.

2. The decoding circuit of claim 1, wherein the Chien Stage comprises:
a second FFT stage iteratively performing an FFT operation on an output of the first FFT stage; and
a logic circuit configured to generate the error bits from an output of the second FFT stage.

3. The decoding circuit of claim 1, further comprising:
a hard decision buffer;
a soft decision buffer; and
an input control circuit configured to store the BCH encoded word as hard decision bits in the hard decision buffer for output to the BCH decoder and store soft decision bits in the soft decision buffer indicating reliability of bits of the BCH encoded word.

4. The decoding circuit of claim 3, wherein the decoding circuit performs the error correction of the BCH encoded word additionally using the soft decision bits.

5. The decoding circuit of claim 3, further comprising a delta syndrome memory storing delta-syndromes and the BCH decoder performs the error correction on the data the BCH encoded word additionally using the stored delta-syndromes.

6. The decoding circuit of claim 5, further comprising a Delta-Syndrome calculator, where a result of decoding the BCH encoded word successfully by the BCH decoder is output to the Delta-Syndrome Calculator for calculating the delta-syndromes.

7. The decoding circuit of claim 5, further comprising a Reed-Solomon decoder to correct at least one of the delta-syndromes stored in the delta syndrome memory.

8. The decoding circuit of claim 3, wherein the BCH decoder reads the soft decision bits from the soft decision buffer, and the BCH decoder flips one or more bits of the hard decision bits corresponding to bits of the soft decision bits with low reliability based on a certain probability.

9. The decoding circuit of claim 8, further comprising a pseudo random number generator generating a pseudo-random number and the certain probability is generated from the pseudo-random number.

10. The decoding circuit of claim 1, further comprising an output buffer configured to store a certain amount of data output by the BCH decoder at a predetermined rate.

11. The decoding circuit of claim 10, wherein the output buffer comprises:

an even memory comprising a plurality of first rows configured to each store three times the certain amount of data output; and
an odd memory comprising a plurality of second rows configured to each store three times the certain amount of data output,
wherein the BCH decoder continues to output additional first data to the even memory until the even memory is full and then begins outputting additional second data to the odd memory.

12. The decoding circuit of claim 11, wherein the output buffer further comprises:
a plurality of 2 to 1 first multiplexers, where each first multiplexer receives one bit of the even memory and one bit of the odd memory to output three times the certain amount of data output; and
a FIFO configured to receive outputs of the first multiplexers.

13. The decoding circuit of claim 12, the output buffer further comprising:
a plurality of 60 to 1 multiplexers receiving an output from the FIFO;
a buffer comprising a first part storing a first half of data output by the 60 to 1 multiplexers and a second part storing a second half of the data output by the 60 to 1 multiplexers; and
a plurality of 2 to 1 second multiplexers, where each second multiplexer receives one bit from the first part and one bit from the second part.

14. A method for preforming an error correction in a memory system, the method comprising:
generating syndromes based on a Bose-Chaudhuri-Hocquenghem (BCH) encoded word stored in the memory system;
performing a Berlekamp-Massey algorithm on the syndromes to generate Error Location Polynomial (ELP) coefficients;
performing a Chien search on the ELP coefficients using a Fast Fourier Transform (FFT) circuit to generate error bits and iteration information;
reordering the error bits to be sequential based on the iteration information; and
performing the error correction on data of the BCH encoded word using the reordered error bits,
wherein the FFT circuit includes a first FFT stage iteration operating on the ELP coefficients and the iteration information is generated from an output of a counter incremented for each iteration of the first FFT stage.

15. The method of claim 14, wherein performing the Chien search comprises:
using a second FFT stage of the FFT circuit to iteratively perform an operation on an output of the first FFT stage; and
generating the error bits from an output of the second FFT stage.

16. A decoding circuit for performing an error correction in a memory system, the decoding circuit comprising:
a Bose-Chaudhuri-Hocquenghem (BCH) decoder comprising:
a Syndrome stage for generating syndromes based on a BCH encoded Word stored in the memory system;
a Berlekamp-Massey (BM) stage performing a Berlekamp-Massey algorithm on the syndromes to generate Error Location Polynomial (ELP) coefficients;
a first Fast Fourier Transform (FFT) stage iteratively performing a first FFT operation on the ELP coefficients to generate first results;

a second FFT stage iteratively performing a second FFT operation on the first results to generate second results; and a logic circuit configured to generate error bits from the second results, generate iteration information from an output of a counter incremented for each iteration of the first FFT stage, and reorder the error bits based on the iteration information, wherein the BCH decoder performs the error correction on data of the BCH encoded word using the reordered error bits.

17. The decoding circuit of claim 16, further comprising:
a hard decision buffer;
a soft decision buffer; and
an input control circuit configured to store the BCH encoded word as hard decision bits in the hard decision buffer for output to the BCH decoder and soft decision bits in the soft decision buffer indicating reliability of bits of the BCH encoded word.

18. The decoding circuit of claim 17, wherein the BCH decoder reads the soft decision bits from the soft decision buffer, and the BCH decoder flips one or more bits of the hard decision bits corresponding to bits of the soft decision bits with low reliability based on a certain probability.

* * * * *